(12) United States Patent
Thuaire et al.

(10) Patent No.: US 8,692,385 B2
(45) Date of Patent: Apr. 8, 2014

(54) DEVICE FOR CONNECTING NANO-OBJECTS TO EXTERNAL ELECTRICAL SYSTEMS, AND METHOD FOR PRODUCING SAID DEVICE

(75) Inventors: Aurélie Thuaire, Voiron (FR); Xavier Baillin, Crolles (FR); Nicolas Sillon, Saint Egreve (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 244 days.

(21) Appl. No.: 13/311,146

(22) Filed: Dec. 5, 2011

(65) Prior Publication Data
US 2012/0161333 A1   Jun. 28, 2012

(30) Foreign Application Priority Data

Dec. 23, 2010   (FR) .................................. 10 61128

(51) Int. Cl.
*H01L 23/52* (2006.01)
*B82Y 10/00* (2011.01)

(52) U.S. Cl.
USPC .... 257/775; 257/724; 257/773; 257/E23.145; 438/125; 977/723

(58) Field of Classification Search
USPC .................. 257/701–726, 773–776, E23.145; 361/748–804; 438/107–109; 977/701–723
See application file for complete search history.

(56) References Cited

U.S. PATENT DOCUMENTS

| | | | | |
|---|---|---|---|---|
| 6,442,042 B2* | 8/2002 | Ramcke et al. | ................ | 361/760 |
| 7,659,631 B2* | 2/2010 | Kamins et al. | ................ | 257/775 |
| 8,043,891 B2* | 10/2011 | Huang | ........................ | 438/106 |
| 8,124,527 B2* | 2/2012 | Lacey et al. | ................... | 438/637 |
| 2311/0018138 | | 1/2011 | Thet et al. | |

FOREIGN PATENT DOCUMENTS

WO   WO 2009/022982 A1   2/2009

OTHER PUBLICATIONS

French Search Report issued Aug. 4, 2011 in patent application No. 1061128 with English Translation of Category of Cited Documents.
C. Kergueris, et al., "Electron Transport Through a Metal-Molecule-Metal Junction", Physical Review B, vol. 59, No. 19, May 15, 1999, pp. 12 505-12 513.

\* cited by examiner

*Primary Examiner* — Steven J Fulk
*Assistant Examiner* — Eric Ward
(74) *Attorney, Agent, or Firm* — Oblon, Spivak, McClelland, Maier & Neustadt, L.L.P.

(57) ABSTRACT

Device for connecting nano-objects to external electrical systems, and method for producing the device.
According to the invention, which applies in particular to molecular characterization, a device including the following is produced: an upper layer equipped with upper contact pads to be connected to a nano-object; a lower layer, equipped with lower contact pads to be connected to an external electrical system; above the lower layer, a bonding layer including electrical through-vias in contact with the lower pads; and, between the bonding layer and the upper layer, at least two layers equipped with conductive lines and electrical vias, for connecting the upper pads to the lower pads.

17 Claims, 6 Drawing Sheets

DEVICE FOR CONNECTING NANO-OBJECTS TO EXTERNAL ELECTRICAL SYSTEMS, AND METHOD FOR PRODUCING SAID DEVICE

TECHNICAL FIELD

This invention relates to a device for connecting nano-objects to external electrical systems, and a method for producing said device.

The term "nano-objects" refers to objects of which at least one of the dimensions is in the range from 1 nm to 100 nm. Nanoparticles (organic or inorganic), nanotubes, nanowires, molecules and molecule combinations, in particular biological molecules such as "small" viruses and bacteria, for example, are included in this category of nano-objects.

The invention is applicable in particular in electronics, optics, chemistry and biology. In particular, it makes it possible to produce, on the one hand, molecular characterization units and, on the other hand, hybrid chips, for example MOS/molecule hybrid circuits.

The invention makes it possible, inter alia, to integrate molecular electronics to microelectronics, in particular to CMOS technology. It is at the interface between the top-down approach and the bottom-up approach.

It is noted that the top-down approach is that in which, from macroscopic materials, it is sought to produce electronic components, for example MOS transistors or sensors, by producing these components in smaller and smaller sizes and giving them increasingly large functionalities. The bottom-up approach is intended to produce functional elements from an electronic, optical or chemical perspective, from molecules.

The invention proposes, inter alia, a device making it possible to characterize and make use of the electrical, optical, chemical and even biological properties of molecules that have been intentionally synthesized. This device is obtained by means of tools, methods and infrastructures that have been developed in microelectronics for the production of advanced MOS transistors (narrow-gate transistors).

The invention also proposes a new architecture making it possible to integrate both molecular components and microelectronic components on the same substrate.

It should be noted that, at present, molecules must be manipulated in a vacuum, using nanometric probes, by means of equipment that is not very compatible with the production of industrial-scale components: this equipment essentially consists of STM i.e. scanning tunnelling microscopes and AFM, i.e. atomic force microscopes.

PRIOR ART

With regard to the bottom-up approach, to position and electrically characterize molecules, STM and AFM as well as the break junction technique are essentially known.

STM and AFM are very effective, but require working in vacuum chambers, and are not suitable for the characterization of a large number of components. The break junction technique produces systems of which the shape (in particular the location of the break and the size of the junction created) is difficult to control. For more information on this technique, reference should be made, for example, to the following document:

[1] C. Kergueris et al., Phys. Rev. B—Condensed Matter, 59, 12505, 1999.

With regard to the top-down approach, a device making it possible to connect a nano-object to an external electrical circuit is known from the following document, to which reference should be made:

[2] WO 2009/022982, Nano-interconnects for atomic and molecular scale circuits.

However, probes are necessary for connecting the nano-object to the external electrical circuit by means of this device. The latter is thus unsuitable for a direct connection to an electrical circuit such as an integrated circuit, for example.

In addition, this device does not enable integrated rerouting of nano-objects with one another or rerouting to external electrical systems.

DESCRIPTION OF THE INVENTION

This invention is intended to overcome the disadvantages mentioned above.

Owing to its design, the device of the invention can be directly connected to an external electrical system such as an integrated circuit, for example: it integrates a rerouting, which can be more or less complex between its upper and lower faces.

In addition, the device of the invention can connect nano-objects which are hybridized on its upper face to microelectronic circuits such as transistors or diodes, advantageously formed at the same level as the connection pads of these nano-objects.

The method of the invention is moreover suitable for heating at high temperature: as will be made more clear below, a high-temperature exposure (on the order of 1000° C.) may be necessary both to activate doping agents after implantation of the area for receiving the nano-objects and to restore the crystallographic structure of the latter (step preceding the controlled attachment of nano-objects).

Specifically, this invention relates to a device for connecting at least one nano-object to at least one external electrical system, which device includes:

a first level including at least two first electrical contact elements, intended to be connected to the nano-object;

a second level including at least two second electrical contact elements, intended to be connected to the external electrical system, in which the second elements have larger dimensions than the dimensions of the first elements; and an intermediate level, located between the first and second levels and making it possible to connect the first elements to the second elements, characterized in that:

the first level also includes a first layer, equipped with the first elements, in which the first elements are electrically insulated from the rest of the first layer;

the second level also includes a second layer, equipped with the second elements, in which the second elements are electrically insulated from the rest of the second layer, and a bonding layer, arranged between the second layer and the intermediate level and including at least two electrical through-vias, respectively in contact with the second electrical contact elements; and the intermediate level is intended to connect the vias of the second level with the first electrical contact elements and includes a stack of at least two intermediate layers, respectively equipped with a set of electrically conductive lines that are electrically insulated from the rest of the corresponding layer, and a set of electrical through-vias that are electrically insulated from the rest of the corresponding layer.

The upper face of the device can thus form a platform for receiving nano-objects, while the rear face of the device can be placed in contact with a suitable electrical system, having, for example, electrical contact pads to be connected to the pads of the device. The electrical system can in particular be an integrated circuit of a characterization system or a control system or a reading system.

According to the invention, the first and second layers and the intermediate layers can be independently insulating, semiconductive or conductive; when one of these layers is conductive or semiconductive, the conductive elements arranged in this layer are electrically insulated from the rest of said layer by a dielectric (for example, an oxide layer).

According to a specific embodiment of the device, the first level includes more than two first electrical contact elements. The intermediate level is then suitable for connecting at least one of the second electrical contact elements to at least two of the first electrical contact elements. This particular embodiment makes it possible in particular to connect a nano-object having more than two connectors or to connect several nano-objects together.

In the invention, the first level can include more than two first electrical contact elements for connecting them to at least two nano-objects (or to a single nano-object having more than two connectors); the intermediate level is then suitable for connecting the nano-objects to one another. This particular embodiment makes it possible in particular, by connecting different nano-objects together, to form a molecular circuit.

According to a particular embodiment of the invention, the first level also includes at least one microelectronic circuit having electrical connections and the intermediate level is then suitable for connecting the nano-object(s) to the electrical connections of the microelectronic circuit. This microelectronic circuit includes, for example, one or more transistors or one or more diodes, such as CMOS.

The device of the invention can also include at least one cap defining at least one cavity that is suitable for enclosing the nano-object(s).

This cap can be suitable for enabling the nano-object(s) that it contains to interact with the environment outside the cap.

Each of the cavities defined by the cap can have a controlled atmosphere, and, for example, contain a gas or a liquid, or be under vacuum. The cap can thus insulate all or some of the molecular circuit. It can insulate the nano-objects from the ambient environment collectively or individually. And it can have one or more cavities that can receive possibly separate fluids.

This cap can have functionalities and properties that are advantageous for the nano-objects that it contains: transparency to certain wavelengths for optical applications, porosity or hermeticity of the cap, functionalization of the cap for chemical or biological applications, insertion of a getter, and so on.

The invention also relates to a method for producing a device for connecting at least one nano-object to at least one external electrical system, in which:
 a first level is formed, including a first layer equipped with at least two first electrical contact elements that are electrically insulated from the rest of the first layer and intended to be connected to the nano-object;
 an intermediate level is formed, including a stack of at least two intermediate layers, respectively equipped with a set of electrically conductive lines that are electrically insulated from the rest of the intermediate layers and a set of electrical through-vias that are electrically insulated from the rest of the intermediate layers, and that are respectively in contact, on one side, with the first elements and, on the other side, with the electrically conductive lines; and
 a second level is formed, including a second layer, equipped with at least two second electrical contact elements that are electrically insulated from the rest of the second layer and intended to be connected to the external electrical system, and a bonding layer, arranged between the second layer and the intermediate level and including at least two other electrical through-vias, respectively in contact, on one side, with the second electrical contact elements and, on the other side, with the electrically conductive lines of the intermediate level.

According to a preferred embodiment of the method of the invention, the conductive liens of at least one of the levels, taken from the first level, the second level and the intermediate level, are made of silicon, and the vias are formed by silicidation of openings previously formed on said lines in the layer(s) of the corresponding level and by filling all or some of said openings with an electrically conductive material.

According to a preferred embodiment of the method of the invention, to form the second level:
 a substrate including electrical blind vias is used,
 this substrate is attached on the intermediate level,
 this substrate is thinned in order to obtain the other electrical through-vias, and
 the bonding layer and the second electrical contact elements are formed on the substrate thus thinned.

Alternatively, to form the second level, the substrate including the electrical through-vias, the bonding layer, and the second electrical contact elements are attached on the intermediate level.

Preferably, the substrate including the second level is attached on the intermediate level by direct bonding, or molecular bonding. This bonding can be of the SDB type (Silicon Direct Bonding). Nevertheless, other types of bonding may also be suitable.

Preferably, the first layer is semiconductive and the first electrical contact elements are formed by implantation of doping agents in the first layer.

According to a preferred embodiment of the invention, to form the first level, a silicon-on-insulator-type substrate is used, including a base substrate, an oxide layer on the base substrate, and a silicon layer on the oxide layer, the first layer consists of the silicon layer and, after having attached the second level on the intermediate level, itself formed on the first level, the base substrate and the oxide layer are removed.

In an advantageous method of the invention, the structure thus obtained is annealed in order to activate the doping agents and restore the crystalline structure (for example, at a temperature of the order of 1000° C.). This annealing also makes it possible, if an attachment of the second level is used, to reinforce the bonding strength.

According to an advantageous embodiment of the invention, it is possible to attach a cap, having at least one cavity, on the first level of the device.

This cap can be made of materials making it possible to ensure a particular function of the cap for a given application (transparency, porosity, etc.).

According to a preferred embodiment, the cap is attached by direct bonding on the first level of the device.

According to an advantageous embodiment of the invention, the cap is attached temporarily, thus making the device a reusable interface or platform, or it is attached permanently.

BRIEF DESCRIPTION OF THE DRAWINGS

This invention will be better understood in view of the following description of examples of embodiments, hereinafter provided purely for indicative and non-limiting purposes, by referring to the appended drawings, in which.

DETAILED DESCRIPTION OF PARTICULAR EMBODIMENTS

Figure 1:
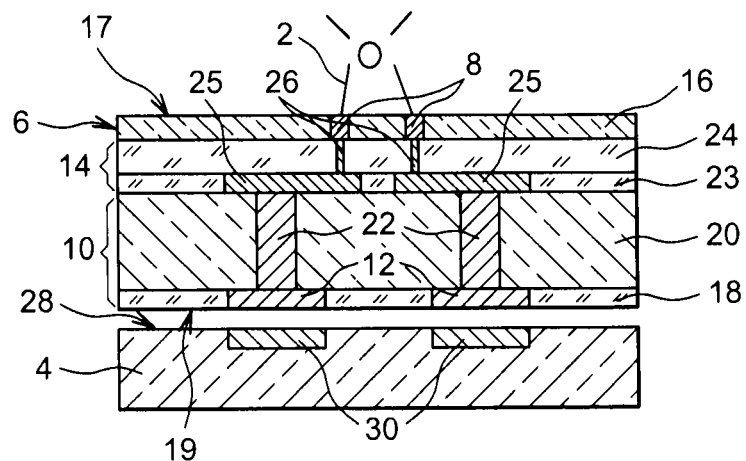
FIGS. 1 to 5 are diagrammatic cross-section views of particular embodiments of the device of the invention, and FIGS. 6A to 6F diagrammatically show various steps of a method for producing a device according to the invention.

FIG. 1 is a diagrammatic cross-section view of a first particular embodiment of the device of the invention.

In the example of FIG. 1, the device is intended to connect a nano-object 2, for example a molecule, to an external electrical system 4, for example a three-dimensional integrated circuit.

The device of FIG. 1 includes:
- a first level 6, or upper level, including two electrical contact elements 8, or upper contact pads, intended to be connected to the nano-object 2 (nanometric interconnections),
- a second level 10, or lower level, including two electrical contact elements 12, or lower contact pads, intended to be connected to the external electrical circuit 4 (micrometric interconnections), and
- an intermediate level 14, located between the upper level 6 and the lower level 10, and enabling an electrical bond to be established between the upper pads 8 and the lower pads 12.

According to the invention, the upper level 6 also includes a preferably electrically insulating or semiconductive layer 16 of which one face forms the front face 17 of the device and in which the pads 8 are located. As can be seen, each of them extends over the entire thickness of the layer 16 and is thus flush with the two faces of same.

The lower level 10 includes a layer 18 that is preferably electrically insulating, of which one face forms the rear face 19 of the device and in which the pads 12 are located. Each of these also extends over the entire thickness of the layer 18 and is thus flush with the two faces of same.

In addition, the lower level 10 includes a bonding layer 20, arranged between the layer 18 and the intermediate level 14. The layer 20 includes two electrical through-vias 22, or lower vias.

The intermediate level 14 is intended to respectively connect the lower vias 22 to the upper pads 8 and includes a stack of two intermediate layers 23 and 24.

Layer 23 is located between layer 20 and layer 24 and is equipped with two electrically conductive lines 25 that are electrically insulated from the rest of the layer; while layer 24 is equipped with two electrical vias 26, or intermediate vias, which are electrically insulated from the rest of the layer. In this example, each conductive line 25 extends over the entire thickness of layer 23 and is thus flush with the two faces of same.

As can be seen, each via 26 is connected, on one side, to an upper pad 8, and, on the other side, to a line 25. And each via 22 is connected, on one side, to a lower pad 12, and, on the other side, to a line 25.

The upper face 17 of the device of FIG. 1 can thus form a platform for receiving nano-objects, while the rear face 19 of the device can be placed in contact with a suitable electrical system 4, having, for example, electrical contact pads 30 to be connected to the pads or elements 12 of the device.

The electrical system can in particular be an integrated circuit of a characterization system or a control system or a reading system.

According to the invention, the first and second layers and the intermediate layers can be independently insulating, semiconductive or conductive; when one of these layers is conductive or semiconductive, the conductive elements arranged in this layer are electrically insulated from the rest of said layer by a dielectric (for example, an oxide layer).

This device makes it possible, for example, to determine electrical properties of a molecule. To do this, the device is placed in a suitable measuring chamber (not shown), a vacuum is produced in said chamber, the molecule to be characterized is connected between the two upper pads 8, a voltage is applied between the two lower pads 12 (and therefore between the upper pads 8) and the current that passes through the molecule is measured.

This makes it possible, for example, to trace current-voltage characteristics of the molecule.

The application of the voltage and the measurement of the current can be carried out by means of a suitable integrated circuit 4. A face 28 of the latter comprises electrical contact pads 30 that can be connected respectively to the pads 12 after the face 28 has been placed directly in contact with the rear face 19 of the device (free face of the layer 18).

Instead of such an integrated circuit 4, it is possible to use a suitable macroscopic measuring device, equipped with probes, and to apply them respectively against the lower pads 12 of the device (which forms a sort of connector due to said pads).

It should be noted that the upper pads 8 form, in a certain way, a contact plug that makes it possible to do without the nanometric probes of AFMs and STMs.

Figure 2:
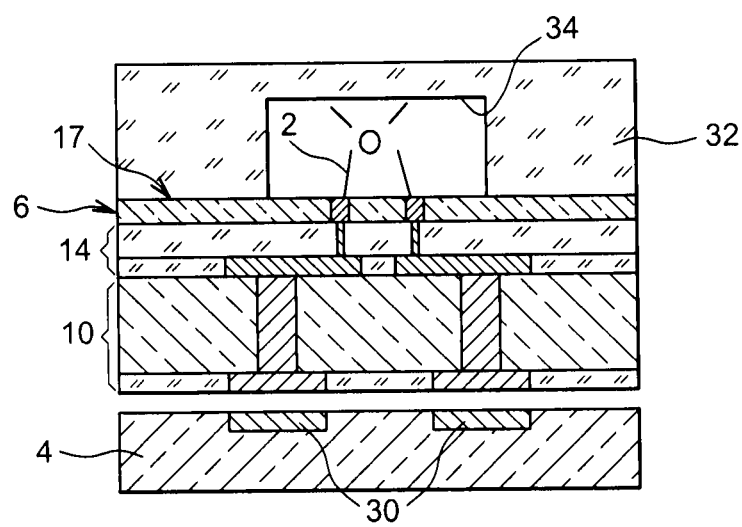

FIG. 2 is a diagrammatic cross-section view of another particular embodiment of the device of the invention.

The device shown in FIG. 2 results from the addition of a cap on the device described in reference to FIG. 1. More specifically, a cap 32 suitable for enclosing or insulating the nano-object 2 is added to this device. The cap 32 is attached tightly to the upper face 17 of the device and therefore defines a sealed cavity 34 in which the nano-object 2 is placed.

It is thus possible to analyze this nano-object in a fluid, i.e. a gas or a liquid, or under vacuum. And when the fluid is a gas, it is possible to choose its temperature, for example ambient temperature (around 20° C.) as well as its pressure, for example ambient pressure (around $10^5$ Pa) when it is a gas.

To have the vacuum or a liquid or a gas in the cavity 34, it is sufficient to place the device under vacuum or in a liquid or in a gas (at the chosen pressure) and then to fix the cap 32 tightly on the face 17 of the device.

The fluid can then be left at ambient temperature or brought to a higher temperature by heating it by means of the cap (if the latter is thermally conductive).

Unlike the device in FIG. 1, the device of FIG. 2 makes it possible to manipulate a nano-object outside of any specific chamber. This makes it possible, for certain applications, to move the encapsulated nano-object from one characterization instrument to another, or even from one laboratory to another.

In addition, specifications are given to the cap 32 that are in agreement with the uses envisaged for the device of which it is a part. For example, in the field of optics, a transparent cap may be needed for the characterization of certain optical properties; and in the field of chemistry or biology, a porous or functionalized cap may be needed for the characterization of certain chemical or biological properties.

The term "functionalized cap" refers to a cap on which a surface deposit is produced that gives it additional properties (surface properties). It can be a hydrophobic cap, an antifungal cap, and so on.

Figure 3:
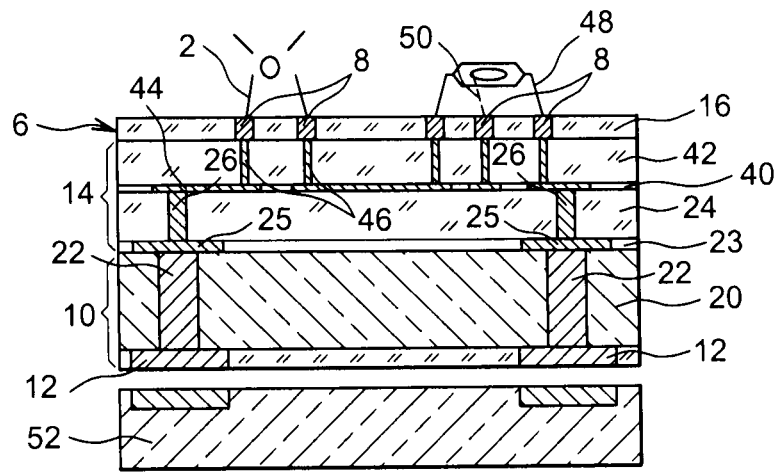

FIG. 3 is a diagrammatic cross-section view of another particular embodiment of the device of the invention.

As can be seen, the device shown in this figure includes an interconnection system that is more complex than those of the devices of FIGS. 1 and 2 and thus makes it possible, for example, to form electrical circuits between several nano-objects; the intermediate level 14 is provided for this purpose.

In the example shown in FIG. 3, the second level 10 is identical to that of FIGS. 1 and 2.

The first level 6 includes more than two electrical contact pads 8: in the example, there are five; in general, this level includes as many pads as there are connections to be established with the nano-objects.

And the intermediate level 14 is a stack of more than two layers: there are four in the example.

In addition to the intermediate layers 40 and 42, respectively equipped with lines 44 and vias 46, this level 14 includes two other intermediate layers 24 and 23, respectively equipped with a set of electrical vias 26 and a set of conductive lines 25. Layer 24 is located between layer 40 and layer 23; and the latter is above layer 10 (second level).

In addition to the nano-object 2, connected between two of the pads 8, another nano-object 48, for example a molecule with three connectors, is connected between three other of these pads 8.

The device of FIG. 3 can also be connected directly, by means of the lower pads 12, to an integrated circuit 52 making it possible, for example, to apply a voltage between these pads and to measure the current that results from it in a circuit established between the nano-objects.

Figure 4:
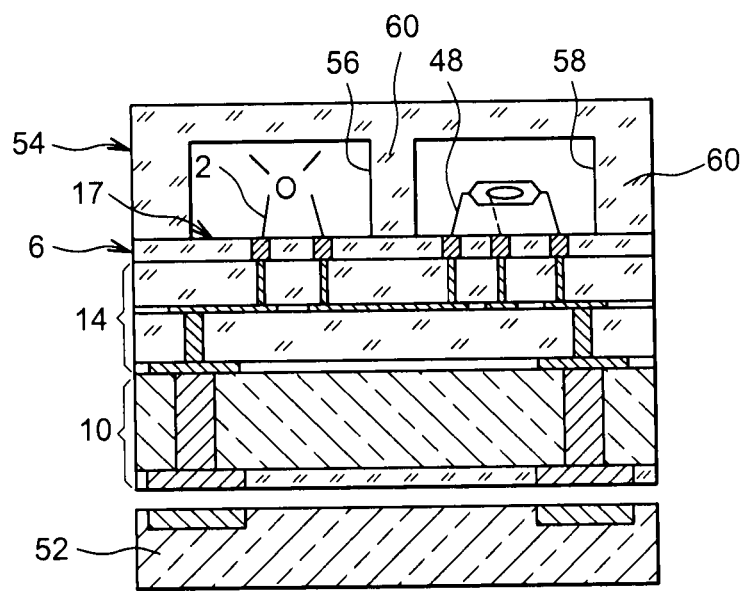

FIG. 4 is a diagrammatic cross-section view of another particular embodiment of the device of the invention.

The device shown in this FIG. 4 results from the addition of a cap to the device described in reference to FIG. 3. More specifically, a cap 54 suitable for enclosing or insulating the nano-objects 2 and 48 is added to this device. The cap 54 is attached tightly to the upper face 17 of the device and defines two cavities 56 and 58 that are separated by a wall 60. The nano-objects 2 and 48 are respectively placed in the cavities 56 and 58.

The use of two cavities makes it possible to study nano-objects that are placed in distinct fluids. However, it is possible to provide a single cavity in order to place the two nano-objects in it and place them under vacuum or expose them to the same fluid; the wall 60 is then removed. The cap can indeed insulate the elements collectively from the ambient environment, or insulate them individually, for example in the case of molecules working with different stimuli.

Figure 5:
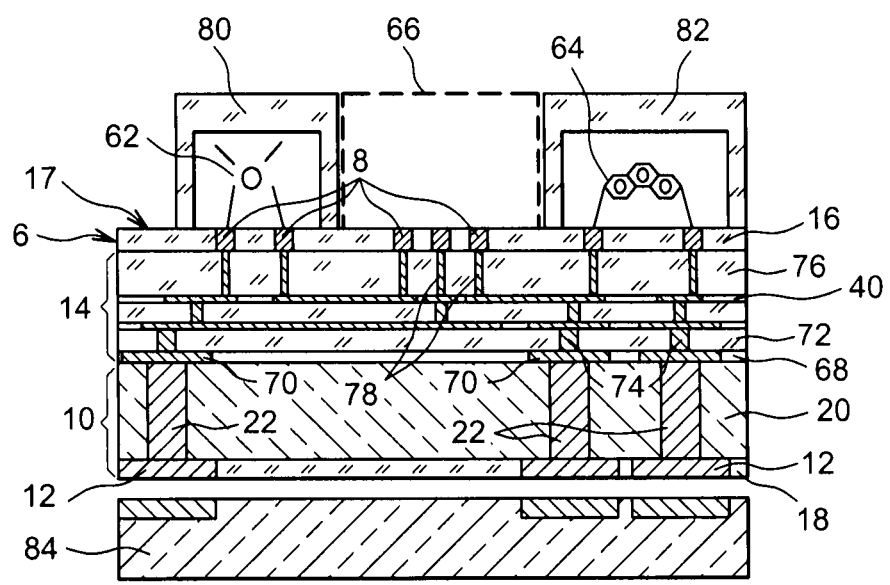

FIG. 5 is a diagrammatic cross-section view of another particular embodiment of the device of the invention.

The device shown in this FIG. 5 enables hybridization of molecular electronics and microelectronics: one or more nano-objects, for example, molecules forming a molecular electronic circuit and a microelectronic circuit, for example of the CMOS type (top-down approach) are simultaneously integrated in this device. In the example shown, two molecules 62 and 64 and a set 66 of MOS transistors are integrated in the device.

The interconnection system comprised by this device makes it possible to form an electrical circuit not only between the molecules 62 and 64 but also between the latter and the set 66 of MOS transistors, or, more generally, between the molecules and a microelectronic circuit. The intermediate level 14 is provided for this purpose.

As can be seen, the upper level 6 of the device of FIG. 5 includes several pads 8 (in layer 16); the lower level 10 includes several pads 12 (in layer 18) and these pads 12 are associated with several electrical through-vias 22 (in layer 20); and the intermediate level is a stack of several intermediate layers, each equipped with electrical vias or conductive lines, which are electrically insulated from the rest of the layer.

More specifically, the lowest intermediate layer of level 14, which layer is denoted by reference 68, comprises conductive lines 70 for connection to the vias of the lower level 10; above the layer 68 is another intermediate layer 72 equipped with electrical vias 74 connected to lines 70, etc.; and the highest intermediate layer of level 14, which layer is denoted by reference 76, is equipped with electrical vias 78 that are connected to the pads 8 of the upper level 6. It is also noted that, in the example shown, some of the lower pads 12 are connected to more than one upper pad 8.

In certain applications of the device of FIG. 5, it is possible to provide an interaction of the molecules with their environment in order to form optical, chemical or biological sensors.

One or more caps can be provided on the upper face 17 of the device, in order to contain the molecular electronic circuit or parts thereof. In the example shown in FIG. 5, the molecules 62 and 64 are respectively tightly enclosed in cavities defined by caps 80 and 82.

As above, an electrical circuit, such as an integrated circuit 84, can be directly connected to the device of FIG. 5 by means of lower pads 12.

Examples of the method for producing a device according to the invention will now be described in reference to FIGS. 6A to 6F.

In these examples, techniques that have been developed for microelectronics are essentially used.

To produce the device, a silicon-on-insulator substrate 86 (FIG. 6A) or SOI substrate is used.

It includes a bulk silicon substrate 88, a silica layer 90, or a buried oxide layer, on the substrate 88, and a silicon thin film 92 on the silica layer 90.

First, contact elements 94 are formed in the silicon layer 92. There are two of these elements in the example described (in general, there are more than two) and they are intended to form the upper contact pads of the device. The layer 92 and the pads 94 form the upper level of said device.

To form the pads 94, doping agents, for example boron, phosphorus or arsenic are implanted in the entire thickness of the silicon layer 92, starting at the front face of the substrate 86 (free face of the layer 92).

This implantation is performed through a mask (not shown). This mask is defined by electron-beam lithography, so that the spacing E, or distance, between two doped areas between which a nano-object, for example, a molecule, is to be connected, is equal to the size of the nano-object or, more specifically, to the distance between the two connection probes of the nano-object.

The spacing E is of the order of a few nanometers to a few hundred nanometers.

Instead of forming the upper pads 94 by implantation, it is possible to envisage forming them by functionalization of the surface for receiving the nano-objects (SAM (for Self-Assembled Monolayer deposition), for example).

Then, the intermediate level of the device (FIG. 6B) is formed. This level comprises a stack of several layers, two in the example described.

To do this, a dielectric layer 96 is formed on the layer 92. In this layer 96, electrical vias 98, or upper vias, are formed, which are in contact with the pads 94. Then, another dielectric layer 100 is formed on the layer 96; and, in this layer 100, conductive lines 102 that are in contact with the upper vias 98 are formed.

As a purely indicative and non-limiting example, to form the layer 96, 0.25 μm to 0.5 μm of silica are deposited; to form the upper vias 98, lithography, etching, stripping, and a deposition of conductive material with good thermal behaviour, for example tungsten, polysilicon or carbon nanotubes, are sequentially performed. The method is completed with CMP or chemical mechanical polishing.

In addition, silicidation can be performed in order to reduce the contact resistance between the pad and the via.

This silicidation consists of forming a compound based on silicon and the metal for filling the via in order for the resistivity of the silicide formed, an intermediate between that of the silicon and that of the conductive material, to facilitate the passage of the current between the two materials.

Silicide is generally formed at high temperature, greater than 500° C., but more frequently at a temperature of the order of 700° C. to 800° C.

The same techniques (lithography, etching, stripping, deposition, CMP) can be used to form layer 100 and lines 102.

Then (FIG. 6C), a substrate 104 is attached on the free face 105 of the layer 100 by direct bonding. First, this substrate 104 has been equipped with electrical blind vias 106 (two vias in the example), intended to be placed in contact with the lines 102 during the attachment.

As a purely indicative and non-limiting example, the substrate 104 is made of silicon and the vias 106 are made of polysilicon. However, it is also possible to use a substrate 104 made of glass, other semiconductive materials (for example SiC or diamond) and vias 106 made of tungsten or even copper.

Figure 6A:
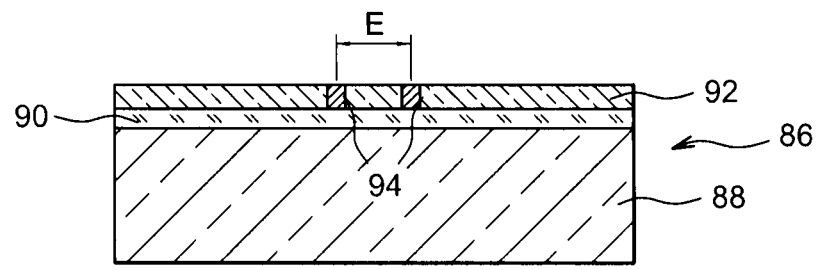
Figure 6B:
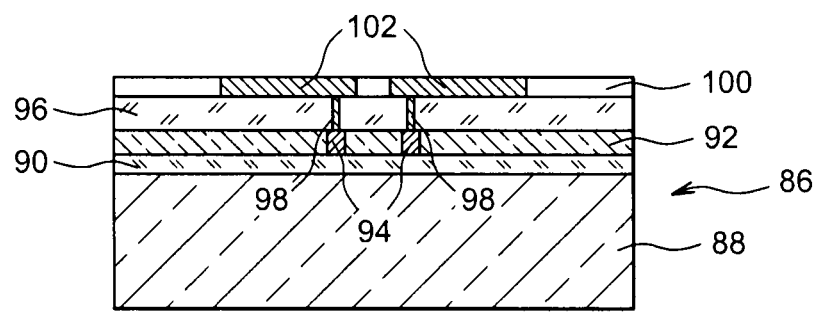
Figure 6C:
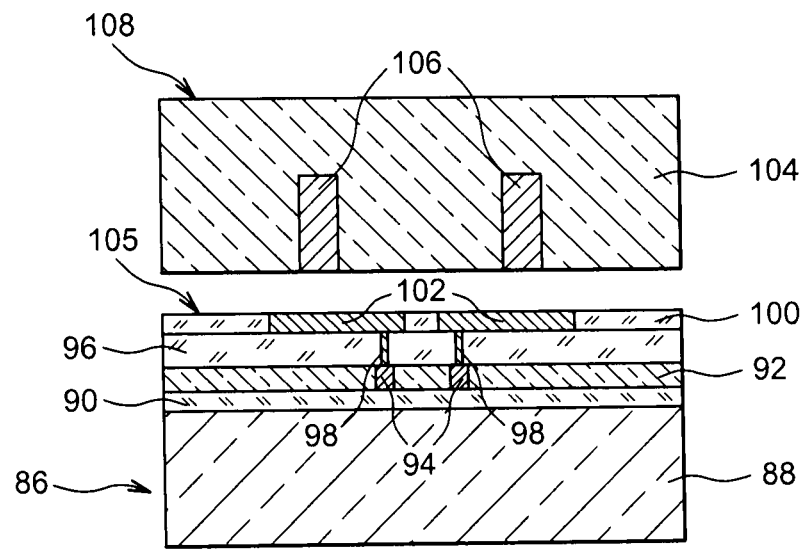
Figure 6D:
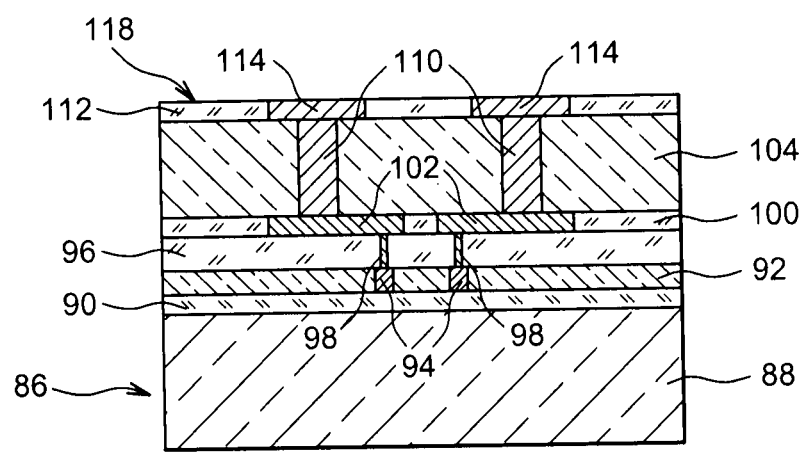
Figure 6E:
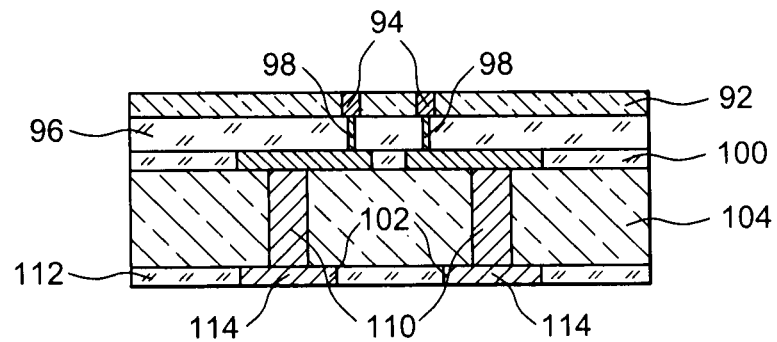
Figure 6F:
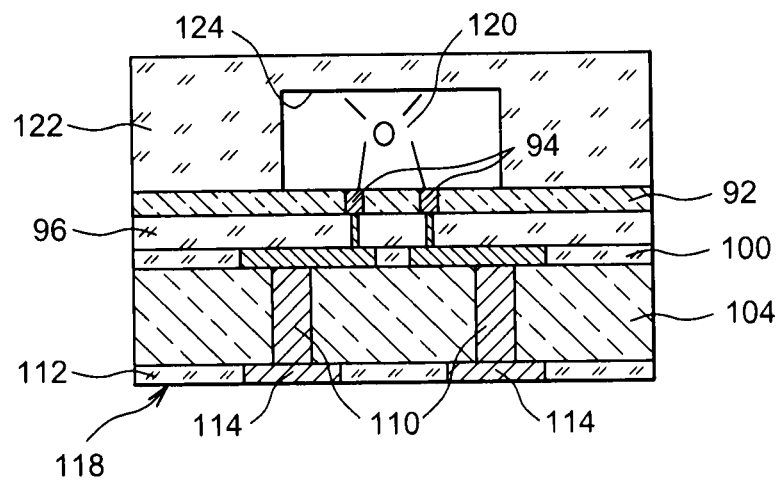

Then, the substrate 104 is thinned from the free face 108 thereof until the vias 106 appear and thus form electrical through-vias 110 (FIG. 6D). Then, a dielectric layer 112 is formed on the face of the substrate 104 where the vias have appeared; and contact pads 114 are formed through the layer 112.

To do this, it is possible to deposit a silica layer, then to form the pads by sequentially performing lithography, etching, stripping, a deposition of the same material as the filling material of the vias (tungsten, polysilicon or even copper) and CMP.

In an alternative embodiment, of which the feasibility is dependent on the thickness of the substrate to be attached, a substrate comprising the vias 110, the layer 112 and the pads 114 is formed; and this substrate is attached on the free face 105 of the layer 100.

After the structure has been turned over, the assembly formed by the substrate equipped with vias 110 and by the layer 112 equipped with pads 114 will form the lower level of the device. The pads 114 will form the lower pads and the free face 118 of the layer 114 will form the lower face.

The structure is then turned over (FIG. 6E) and thinned from its front face: the bulk silicon layer 88 and the oxide layer 90 are removed, exposing the silicon layer 92 containing the upper pads 94.

Then, the structure obtained is annealed at a temperature of the order of 1000 C. This annealing is performed in order to activate the doping agents implanted in the silicon layer 92 and to regenerate the crystalline structure of the silicon after implantation and thinning. Indeed, the surface for receiving nano-objects must be crystallographically perfect in order to enable these nano-objects to be attached.

Thus, a device of the type described in reference to FIG. 1 is obtained.

It is now possible to connect a nano-object to the upper pads 94. For example, it is possible to graft a molecule 120 (FIG. 6F) so that the ends of this molecule are respectively connected to the pads 94.

If necessary, a cap 122 comprising a cavity 124 is then formed, which makes it possible to insulate the nano-object between the cap and the upper face 126 of the device.

Thus, a device of the type described in reference to FIG. 2 is obtained.

To form the cap and attach it tightly to this upper face, the following is performed: the cap is machined so as to create cavities enabling the nano-objects to be protected (lithography, etching, stripping processes); then, it is attached on the upper face of the device by direct bonding, under vacuum (or in the chosen fluid) if necessary. The device is then annealed; the annealing temperature is dependent on the properties of the cap and the type of bonding envisaged: this bonding can be temporary or permanent.

Indeed, the cap can be attached temporarily (possibility of opening the cavity after attachment of the cap) or permanently. The annealing temperature is thus adjusted according to the intended use of the cap.

To obtain devices of the type shown in FIGS. 3 to 5, it is possible to adapt the methods described above in reference to FIGS. 6A to 6F.

As an example, this adaptation can consist of:
  providing, in the layer 94, the pads and/or connections that are necessary for the device to be obtained,
  stacking, on said layer 94, dielectric layers that are respectively equipped with electrical vias or electrically conductive lines so as to obtain the stack necessary for the device,
  then attaching a substrate comprising the electrical through-vias and a layer equipped with contact pads that are necessary for the device, or attaching a substrate equipped with electrical blind vias and continuing the production of the device so as to obtain the through vias and the layer equipped with contact pads.

It is specified that the upper pads 94 can be formed in a layer that is produced in a substrate other than SOI, for example bulk silicon. In this case, the production method described above is adapted.

The upper pads 94 can also be formed in a layer made of an electrically insulating material; and, in this case, the production method described above is also adapted.

In addition, a device according to the invention can be equipped with more advanced electrical connections than the pads 12 (FIG. 1) for connection to an integrated circuit.

It is possible, for example, to replace the pads 12 with electrically conductive lines of the redistribution level or RDL type.

In this case, the production method is adapted as follows: instead of forming pads 114 (FIG. 6D) in the layer 112, electrically conductive lines are formed therein.

This invention makes it possible to characterize active molecules in a simpler and less costly manner than with the tools used in molecular electronics. It also provides an alternative to the miniaturization of components in microelectronics and to the increase in their functionalities. Indeed, the device of the invention can make it possible to integrate, on the same substrate, CMOS components and molecular components.

The invention claimed is:

1. Device for connecting at least one nano-object to at least one external electrical system, which device includes:
   a first level including at least two first electrical contact elements, intended to be connected to the nano-object;
   a second level including at least two second electrical contact elements, intended to be connected to the external electrical system, in which the second elements have larger dimensions than the dimensions of the first elements; and
   an intermediate level, located between the first and second levels and making it possible to connect the first elements to the second elements,
   wherein:
   the first level also includes a first layer, equipped with the first elements, in which the first elements are electrically insulated from the rest of the first layer;
   the second level also includes a second layer, equipped with the second elements, in which the second elements are electrically insulated from the rest of the second layer, and a bonding layer, arranged between the second layer and the intermediate level and including at least two electrical through-vias, respectively in contact with the second electrical contact elements; and
   the intermediate level is intended to connect the vias of the second level with the first electrical contact elements and includes a stack of at least two intermediate layers, respectively equipped with a set of electrically conductive lines that are electrically insulated from the rest of the intermediate layer, and a set of electrical through-vias that are electrically insulated from the rest of the intermediate layer.

2. Device according to claim 1, in which the first level includes more than two first electrical contact elements and in which the intermediate level is suitable for connecting at least one of the second electrical contact elements to at least two of the first electrical contact elements.

3. Device according to claim 1, in which the first level includes more than two first electrical contact elements for being connected to at least two nano-objects or to a single nano-object having more than two connectors, and in which the intermediate level is suitable for connecting the nano-objects to one another.

4. Device according to claim 1, in which the first level also includes at least one microelectronic circuit having electrical connections, and in which the intermediate level is suitable for connecting the nano-object(s) to the electrical connections of the microelectronic circuit.

5. Device according to claim 1, also including at least one cap defining at least one cavity that is suitable for enclosing the nano-object(s).

6. Device according to claim 5, in which the cap is suitable for enabling the nano-object(s) that it contains to interact with the environment outside the cap.

7. Method for producing a device for connecting at least one nano-object to at least one external electrical system, in which:
   a first level is formed, including a first layer equipped with at least two first electrical contact elements that are electrically insulated from the rest of the first layer and intended to be connected to the nano-object;
   an intermediate level is formed, including a stack of at least two intermediate layers, respectively equipped with a set of electrically conductive lines that are electrically insulated from the rest of the intermediate layers and a set of electrical through-vias that are electrically insulated from the rest of the intermediate layers, and that are respectively in contact, on one side, with the first elements and, on the other side, with the electrically conductive lines; and
   a second level is formed, including a second layer, equipped with at least two second electrical contact elements that are electrically insulated from the rest of the second layer and intended to be connected to the external electrical system, and a bonding layer, arranged between the second layer and the intermediate level and including at least two other electrical through-vias, respectively in contact, on one side, with the second electrical contact elements and, on the other side, with the electrically conductive lines of the intermediate level.

8. Method according to claim 7, in which the conductive lines of at least one of the levels, taken from the first level, the second level and the intermediate level, are made of silicon, and the vias are formed by silicidation of openings previously formed on said lines in the layer(s) of the corresponding level and by filling all or some of said openings with an electrically conductive material.

9. Method according to claim 7, in which, to form the second level:
   a substrate including electrical blind vias is used,
   this substrate is attached on the intermediate level,
   this substrate is thinned in order to obtain the other electrical through-vias, and
   the bonding layer and the second electrical contact elements are formed on the substrate thus thinned.

10. Method according to claim 7, in which, to form the second level, the substrate including the electrical through-vias, the bonding layer, and the second electrical contact elements are attached on the intermediate level.

11. Method according to claim 9, in which the substrate including the second level is attached on the intermediate level by direct bonding, or molecular bonding.

12. Method according to claim 7, in which the first layer is semiconductive and in which the first electrical contact elements are formed by implantation of doping agents in the first layer.

13. Method according to claim 12, in which, to form the first level, a silicon-on-insulator-type substrate is used, including a base substrate, an oxide layer on the base substrate, and a silicon layer on the oxide layer, the first layer consists of the silicon layer and, after having attached the second level on the intermediate level, itself formed on the first level, the base substrate and the oxide layer are removed.

14. Method according to claim 13, in which a cap, having at least one cavity, is attached on the first level of the device.

15. Method according to claim 14, in which the cap is attached by direct bonding on the first level of the device.

16. Method according to claim 14, in which the cap is attached temporarily, thus making the device a reusable interface or platform, or it is attached permanently.

17. Method according to claim 10, in which the substrate including the second level is attached on the intermediate level by direct bonding, or molecular bonding.

* * * * *